US006537707B1

(12) United States Patent
Lee (10) Patent No.: US 6,537,707 B1
(45) Date of Patent: Mar. 25, 2003

(54) TWO-STAGE ROUGHING AND CONTROLLED DEPOSITION RATES FOR FABRICATING LASER ABLATION MASKS

(75) Inventor: Lawrence Hakchu Lee, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/525,981

(22) Filed: Mar. 15, 2000

(51) Int. Cl.[7] .............................. G03F 9/00; H05H 1/24; C23C 8/00; G01D 15/00
(52) U.S. Cl. ............................. 430/5; 216/27; 427/576; 427/579; 427/585
(58) Field of Search ........................... 430/5, 322, 323, 430/324; 219/121.7; 216/27; 427/569, 576, 579, 585

(56) References Cited

U.S. PATENT DOCUMENTS

| | | | |
|---|---|---|---|
| 4,923,772 A | 5/1990 | Kirch et al. | 430/5 |
| 5,408,738 A | 4/1995 | Schantz et al. | 29/611 |
| 5,573,875 A | 11/1996 | Kaplan et al. | 430/5 |
| 5,756,236 A | 5/1998 | Cordes et al. | 430/5 |
| 6,162,302 A | * 12/2000 | Raghavan et al. | 134/3 |

* cited by examiner

Primary Examiner—Mark F. Huff
Assistant Examiner—Saleha R. Mohamedulla (57) ABSTRACT

A method of fabricating a high energy radiation mask, such as a laser ablation mask for manufacturing inkjet printheads, includes a multi-stage evacuation process and/or a step of reducing the deposition rate of silicon dioxide during formation of a dielectric stack. When the multi-stage evacuation procedure is combined with the slower deposition rate of silicon dioxide, the resulting mask has a surprisingly low defect density. In the first embodiment, the evacuation procedure is initiated using a low-rate first evacuation connection. The relatively slow purging of a vacuum chamber in which the dielectric stack is subsequently formed controls turbulence and environmental changes that can generate contamination and water along the surface of the substrate on which the dielectric stack is formed. When a pressure setpoint is reached, a second roughing connection is activated to increase the speed of the procedure. The second connection has a higher maximum rate than the first connection. In the preferred embodiment, there is an overlap in the activations of the first and second connections. When another setpoint is reached, a high vacuum connection is activated in order to bring the vacuum chamber to a high vacuum condition for deposition of the dielectric stack. The dielectric stack includes alternating layers of higher refractive index material and low refractive index material. The low refractive index material is silicon dioxide that is deposited at a rate in the optimal range of 1.0 Å/second to 3.0 Å/second. Practical considerations dictate a range of 1.6 Å/second to 2.4 Å/second.

12 Claims, 5 Drawing Sheets

TWO-STAGE ROUGHING AND CONTROLLED DEPOSITION RATES FOR FABRICATING LASER ABLATION MASKS

TECHNICAL FIELD

The invention relates generally to methods and systems for fabricating laser ablation masks and more particularly to approaches to evacuating a vacuum chamber and depositing layers during the fabrication of such masks.

DESCRIPTION OF THE RELATED ART

Laser ablation is one available technique for forming features on the surface of a component or forming through holes in the component. Selected portions of the surface of the component are exposed to high energy laser radiation that causes chemical breakdown of the bonds within the exposed material. Localized expansion occurs as a result of the breaking of the chemical bonds. The material which has expanded can be removed using conventional techniques, such as chemical etching.

A laser ablation mask is typically employed to determine the exposure pattern on the surface of the component. The laser ablation mask utilizes a transparent substrate on which one or more layers can be formed and patterned to provide a coating that defines the exposure pattern. The materials for forming the coating are selected to be resistant to damage as a result of exposure to the laser energy. The substrate and the coating should have a resistance to laser-induced damage during ablation operations in which a laser has a strength greater than 150 mJ/cm$^2$. A suitable substrate material is quartz. The coating on the quartz substrate may be a single metal layer, such as a chromium or aluminum layer. Alternatively, the coating may be formed of multiple dielectric layers having alternating high and low refractive indices. U.S. Pat. No. 4,923,772 to Kirch describes a laser ablation mask that is formed of multiple dielectric layers that are patterned to define the exposure pattern.

Figure 1:
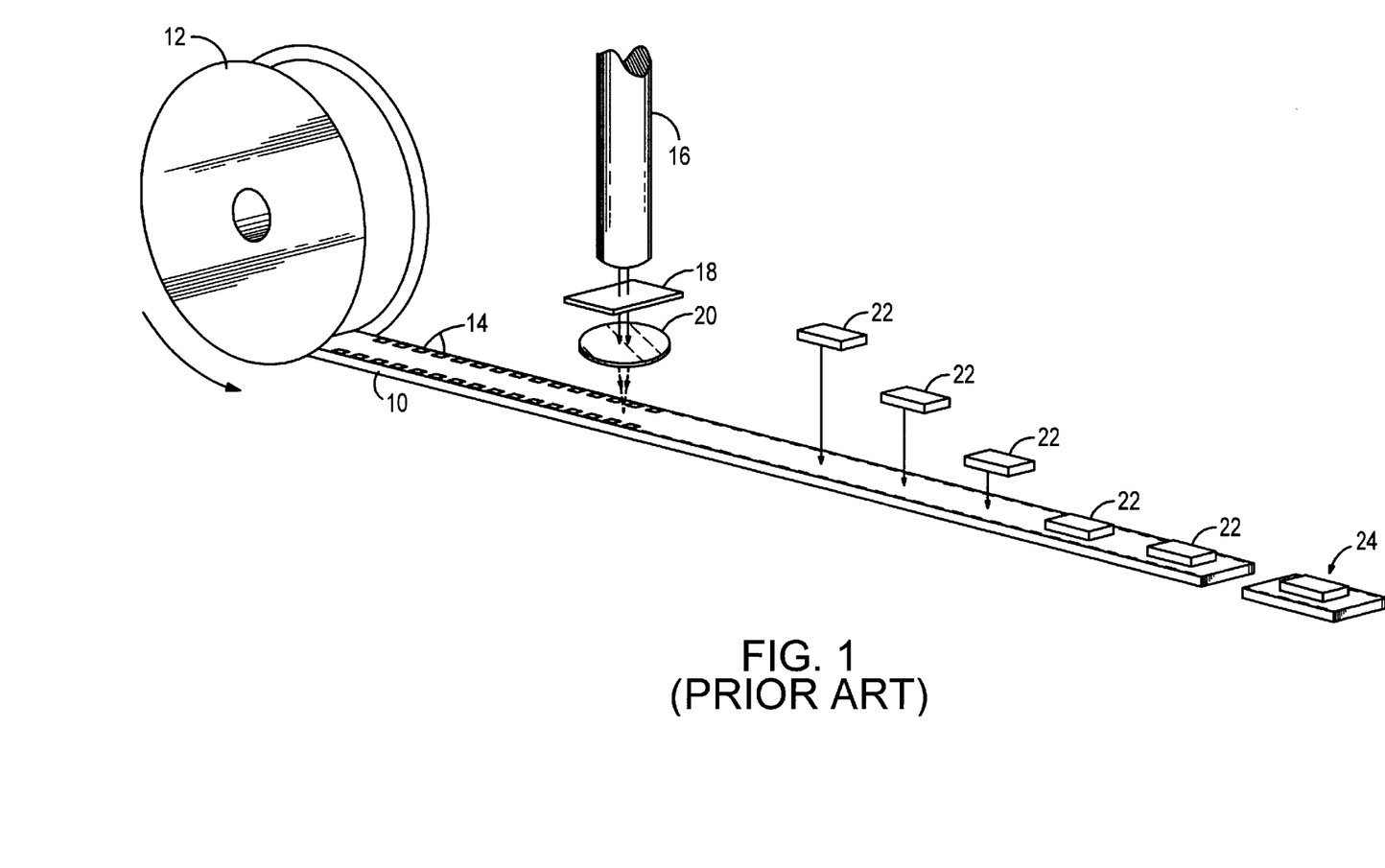
FIG. 1 is a schematic representation of the process for forming inkjet printheads by means of laser ablation, in accordance with both the prior art and the present invention.

FIG. 1 is a schematic representation of the use of laser ablation in the process of forming inkjet printheads. The process is described in greater detail in U.S. Pat. No. 5,408,738 to Schantz et al., which is assigned to the assignee of the present invention. A continuous web 10 of polymer material is removed from a roll 12 in a controlled manner. The web material may be the polymer sold by 3M Corporation under the federally registered trademark KAPTON. Sprocket holes 14 along the opposite sides of the web may be used to precisely control movement of the web material relative to a laser source 16, such as an Excimer laser. While not shown in FIG. 1, the laser source is typically located within a laser processing chamber. One or more laser ablation masks 18 can be patterned to define all of the features that are to be formed within the continuous web 10. The features are repeated at a controlled interval, so that duplicate components for an inkjet printhead may be formed from the web, after the web is diced. In FIG. 1, the mask 18 is patterned to define an array of vaporization chambers. In addition to stepping the movement of the continuous web 10, the laser source 16 may be stepped. The step-and-repeat process is continued until a nozzle member is formed. Optics 20 may be used for focusing the laser energy that propagates through the mask 18.

The treated portion of the web then advances to a cleaning station, not shown, where any debris is removed from the web. The next station is a bonding station at which heater substrates 22 are secured to the web at positions conforming to the arrays of vaporization chambers. Each heater substrate may be a silicon die on which resistors are formed in an array that matches the array of vaporization chambers, so that there is a one-to-one correspondence between the arrays. The web can then be cut in order to provide individual printheads 24 that are attached to other components to form inkjet cartridges.

Returning to the laser ablation mask 18 that is used in the ablation station, there are a number of equally important mask-fabrication steps. The material for forming the mask substrate should be selected for its optical properties, since the laser energy propagates through the substrate. Quartz is a preferred substrate material. The substrate should be thoroughly cleaned prior to forming the coating on at least one surface of the substrate. The cleaning process removes trace organic layers, such as remnants of the compounds that are used to polish the quartz substrate. Impurities may strongly influence the lifetime of the laser ablation mask. The coating is then applied to the substrate. Conventional Physical Vapor Deposition (PVD) techniques may be utilized. PVD processing requires that the substrate be placed in a vacuum chamber and that the chamber be evacuated. Often, a mechanical pump is controlled by a roughing valve to reduce the pressure within the chamber to a particular setpoint of pressure. A second pump is then used to provide a high vacuum environment within the chamber.

Materials are introduced into the vacuum chamber to vapor deposit layers. As previously noted, the coating on the substrate may be a single layer of metal or composite metal, or may be a dielectric stack. The dielectric stack includes layers having alternating high and low indices of refraction. Absorption of laser energy by the mask coating is a major cause of degradation of the mask. Therefore, the mask coating should be reflective to light having the wavelength of the laser energy. Reflection from the dielectric stack is a result of the constructive and destructive interference at the interfaces of abutting layers. Each layer preferably has a thickness of approximately one quarter-wavelength of the laser energy to which it will be exposed. Each pair of dielectric layers reflects a percentage of the incident light. By depositing a sufficient number of layer pairs, nearly all of the laser energy is reflected.

The coating can then be patterned using conventional techniques. For example, reactive ion etching (RIE) or ion beam etching (IBE) maybe employed. While the resulting mask may operate well for its intended purpose, the operational life of the ablation mask is limited. Laser-induced damage to ablation masks is still critically dependent upon the level of coating defect density. That is, the damage that occurs as a result of exposure to the high energy laser radiation will increase with increases in defect density. With each failed mask, time must be taken to replace the mask. The equipment downtime required to replace masks reduces production throughput in an inkjet printhead manufacturing process.

What is needed is a method and system for fabricating a high energy radiation mask so as to increase the operational life of the mask.

SUMMARY OF THE INVENTION

A method of fabricating a high energy radiation mask includes locating a transparent substrate in a vacuum chamber and then executing at least one of (1) reducing the initial rate of evacuating the chamber relative to conventional evacuation techniques and (2) reducing the deposition rate of silicon oxide layers (e.g., SiO$_2$) in a dielectric stack.

When the more controlled evacuation procedure is combined with the slower deposition rate of $SiO_2$, the resulting coating has a surprisingly low defect density. Consequently, the operational life of the mask is extended.

In the first embodiment of the invention, the controlled evacuation of the vacuum chamber includes a two-stage roughing procedure, followed by a high vacuum evacuation step. A first roughing evacuation connection to the vacuum chamber is activated to reduce the pressure to a level below atmospheric pressure. When the chamber environment is reduced to a first threshold pressure (i.e., a first setpoint), a second roughing evacuation connection is activated. The second roughing connection has a maximum purging rate that exceeds the maximum purging rate of the first connection. This may be accomplished by adding a bypass valve to the conventional roughing valve to a pump. The bypass valve may have an orifice that is smaller than the orifice through the roughing valve, thereby providing the difference in the maximum rates of evacuation. In an alternative implementation, the two connections are to separate roughing pumps. This alternative implementation is less preferred, since it requires an additional cost of providing the extra pump.

When the second roughing evacuation connection reduces the chamber environment to a second threshold pressure, the high vacuum connection is activated. The high vacuum connection may be to a diffusion pump or a similar device that is able to achieve and maintain a vacuum pressure required for the material deposition process, such as Physical Vapor Deposition (PVD). Preferably, a dielectric stack is deposited on the substrate. The stack can then be patterned to define a desired exposure pattern. Preferably, the patterning is implemented to form a laser ablation mask for fabricating an inkjet printhead. This requires the substrate coating to include openings for forming an array of vaporization chambers within another substrate.

The different maximum rates of evacuation for the first and second roughing evacuation connections are intended to reduce air turbulence that is created by the vacuum process. For example, in the implementation in which the first connection includes an unconventionally small orifice, while the second connection includes a larger orifice that is conventional to roughing, the initial stage will proceed more slowly (i.e., slower mass removal rate) than is typical. This has two advantages. Firstly, less turbulence will occur so that particulate matter is less likely to settle on the surface of the substrate that is within the vacuum chamber. That is, there is a reduction of the adverse effects of the phenomenon that is sometimes referred to as the Wilson Cloud Effect. Secondly, there is a reduced susceptibility to the process causing water evaporation and condensation, so that liquid is less likely to be introduced onto the surface of the mask substrate. A reduced susceptibility to contamination and water on the surface of the mask substrate reduces the interfacial defect sites between the substrate and the dielectric stack. This also occurs if the dielectric stack is replaced with a single metallic layer, such as chromium or aluminum.

In one implementation of the two-stage roughing process, the activations of the three evacuation connections do not overlap. For example, the first roughing evacuation connection may be activated for the pressure range of 760 Torr to 200 Torr, the second roughing evacuation connection may be activated for the range of 200 Torr to 150 mTorr, and the high vacuum pump connection may be activated for the range that begins at 150 mTorr. However, the preferred implementation includes an overlapping activation of the first and second roughing evacuation connections. This may be achieved by triggering the second connection at 300 Torr, while the first connection does not deactivate until the pressure within the vacuum chamber is reduced to 200 Torr. Because there are fluctuations in vacuum pressure, the overlapping method reduces the likelihood that the first connection will be repeatedly cycled between "activated" and "deactivated" states. Thus, the mechanism for switching the connections will be subjected to less wear and tear. The switching mechanism may be one or more relays, but other approaches may be taken without diverging from the invention.

The system for implementing the two-stage roughing process includes the housing for forming the vacuum chamber, a pressure monitoring mechanism which includes pressure setpoint activated relays, first and second roughing valves with bypass channels, and the high vacuum pump. The first and second roughing valves may be connected to a single roughing pump or may be connected to separate pumps. The monitoring mechanism may include a Pirani gauge and the pressure setpoint activated relays, but other devices may be employed.

As previously noted, the second embodiment of the invention includes a step of depositing the silicon oxide (preferably $SiO_2$ that is evaporated from an $SiO_2$ source material) at an unconventionally low rate. The optimal range was determined to be a deposition rate of 1 Å/second to 3 Å/second. A deposition rate above this range defines a process that is susceptible to a high coating defect density. On the other hand, a deposition rate below the range may result in poor adhesion of the dielectric stack to the mask substrate. Since the deposition rate is subject to fluctuations, the most preferred implementation targets the deposition rate of $SiO_2$ at 2.0 Å/second, so that the fluctuations are likely to remain within the range of 1.6 Å/second to 2.4 Å/second. The coating material that is deposited to form the layers between the $SiO_2$ layers is preferably deposited at the same rate as the $SiO_2$, but the quality of the high refractive index layers is typically less sensitive to deposition rate. An acceptable material is hafnium oxide (e.g., $HfO_2$). The alternating pattern of $SiO_2$ and $HfO_2$ provides the desired alternating pattern of low refractive index material and high refractive index material, respectively.

An advantage of the invention is that the reduction in the density of defects within the laser ablation mask reduces laser-induced damage during use of the mask. As a result, the operational life of the ablation mask is extended. It follows that the frequency of substituting worn ablation masks with replacement masks will decrease during the fabrication of consumer products, such as inkjet printheads, thereby increasing production throughput.

DETAILED DESCRIPTION

Figure 2:
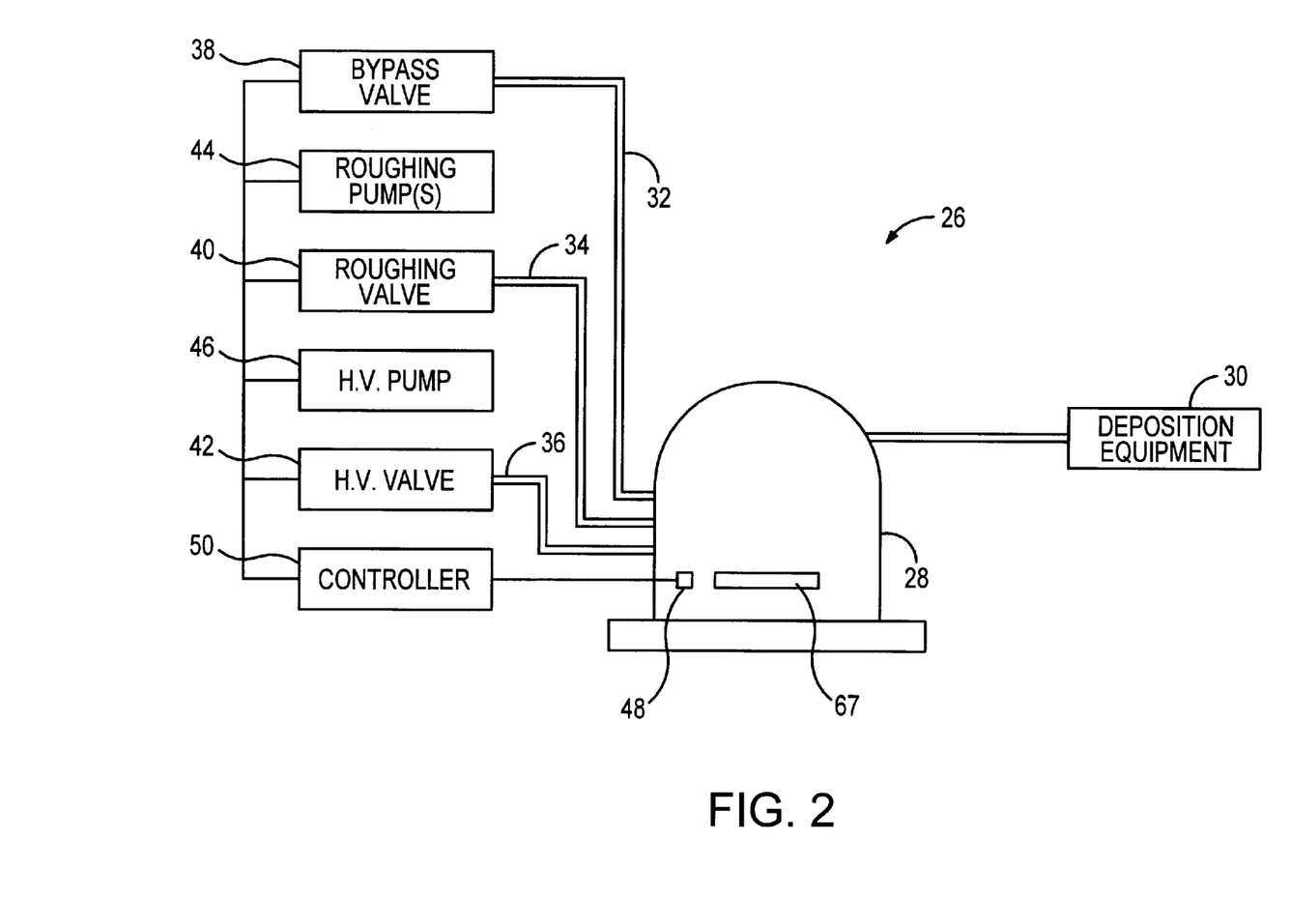
FIG. 2 is a block diagram of components for implementing controlled evacuation and controlled deposition in accordance with the invention.

With reference to FIG. 2, a system 26 for fabricating a laser ablation mask for the inkjet printhead industry is shown as including a vacuum chamber 28. While the invention will be described as being used in a system that is designed for Physical Vapor Deposition (PVD) processing, the techniques are applicable to other processes.

One connection to the vacuum chamber 28 is a link to deposition equipment 30. Equipment that is presently available may be employed. There are also three evacuation connections 32, 34 and 36 to the vacuum chamber. As will be described more fully below, the three evacuation connections are independently activated and deactivated to provide multi-stage purging of the chamber. Each of the connections includes a valve 38, 40 and 42. The bypass valve 38 to the first evacuation connection 32 is initially activated. The main roughing valve 40 is then activated after the pressure within the chamber 28 reaches a preselected setpoint. The maximum rate of evacuation of the first connection 32 is less than the maximum evacuation rate of the second connection 34. Thus, the initial stage of the roughing process will generate less turbulence than if the second connection 34 were to be used at the initial stage. Since the chamber is more susceptible to turbulence-induced adverse effects at the start of evacuation, the reduced capacity of the first connection can be selected to achieve a lower defect density for laser ablation masks. In one implementation, the second evacuation connection 34 has an opening that is consistent with conventional roughing evacuation, while the first connection 32 has an opening that is unconventionally small.

The bypass valve 38 and the roughing valve 40 are shown as being linked to one or more roughing pumps 44. In one embodiment, the valves are connected to separate pumps. However, in the preferred embodiment, the valves are linked to the same pump, thereby reducing the expense of the system 26. The roughing pump may be a conventional mechanical pump used in known PVD systems.

The third evacuation connection 36 is linked to the high vacuum valve 42, which is linked to a high vacuum pump 46. The valve and the pump may be conventional devices. For example, the high vacuum pump may be a diffusion pump, but cryogenic or turbomolecular pumps may be employed. The third connection 36 is activated after the first and second connections 32 and 34 reduce the pressure within the chamber 28 to a second activation setpoint. The roughing process evacuates the chamber to intermediate vacuum, while the diffusion pump is able to decrease the chamber pressure to a high vacuum condition. A suitable pressure setpoint for activation of the high vacuum valve 42 is 150 mTorr.

Pressure within the chamber 28 may be monitored using a Pirani gauge 48. However, other known monitoring devices may be used. A Pirani gauge utilizes two load resistors connected to legs of a half bridge circuit. The load resistors have positive temperature coefficients. One of the two load resistors is insulated, so that heat produced by conduction of current through the insulated resistor is radiated in the surrounding gas. The other load resistor is connected to a heat sink at ambient temperature, so that the voltage drop across the resistor is more directly related to ambient temperature. As the gas pressure falls below atmospheric pressure, there are fewer gas molecules to conduct the heat from the insulated load resistor. Consequently, the insulated resistor will rise to a temperature above ambient temperature. The positive temperature coefficient of the insulated resistor causes an increase in the resistance of the resistor. In turn, the increased resistance produces a higher voltage drop across the resistor. Because the thermal conductivity of the gaseous environment about the insulated resistor is a function of the pressure within the environment, the voltage drop across the resistor is a function of pressure. The half bridge circuit functions to subtract the effects of change in ambient temperature from the effects of change in pressure. While a Pirani gauge is described, there are other known techniques for monitoring the pressure within the chamber 28.

The gauge 48 is connected to a controller 50 that regulates the activation of the three valves 38, 40 and 42. The controller includes switching circuitry and may also include the signal processing circuitry for determining chamber pressure based upon signals from the gauge 48. The switching circuitry may be implemented in an embodiment that allows an overlap in the pressure ranges for activating the three connections 32, 34 and 36 (as will be described with reference to FIG. 3). Alternatively, the implementation may be one in which the three ranges are mutually exclusive (as will be explained with reference to FIG. 4).

Figure 3:
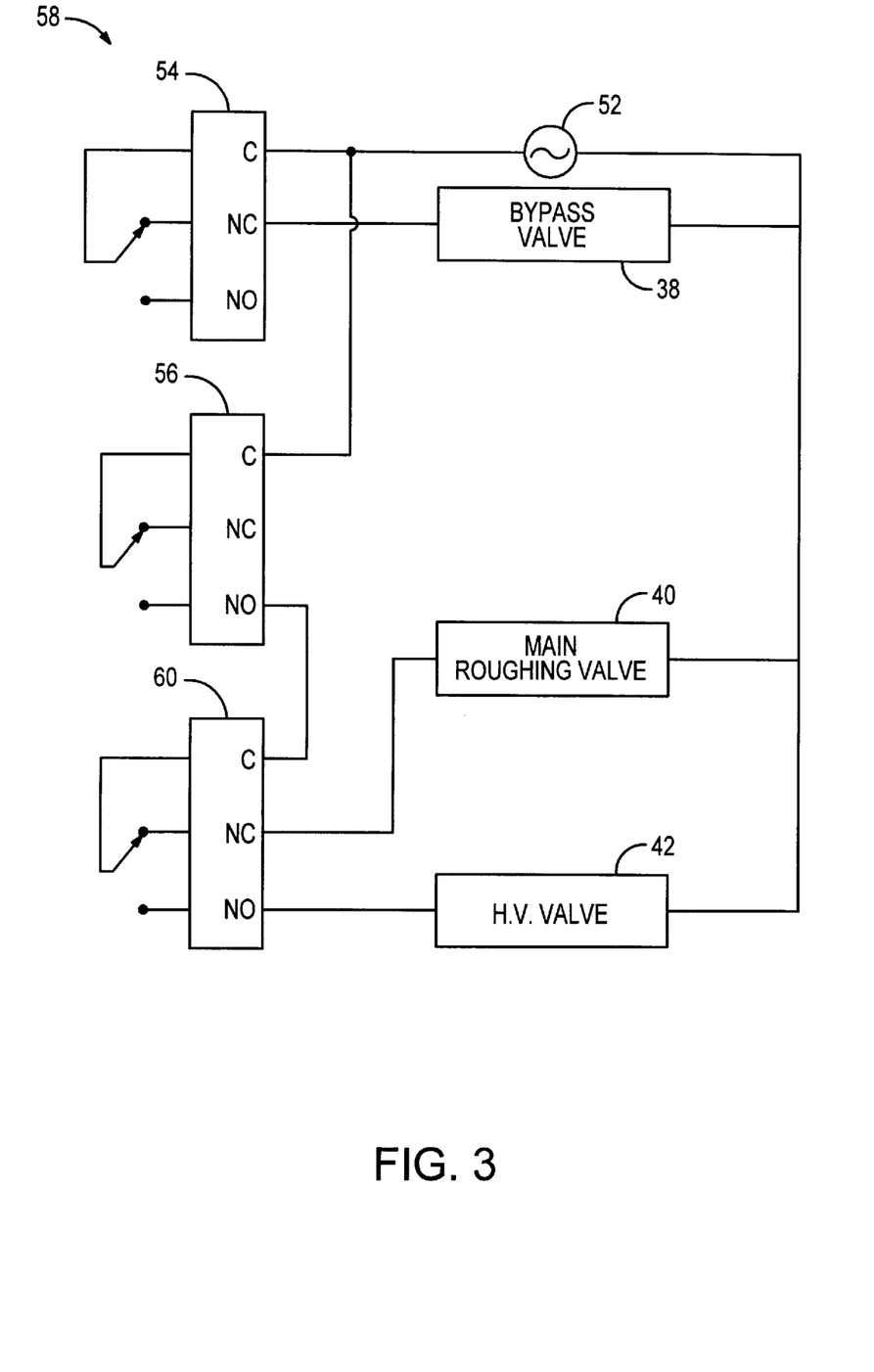
FIG. 3 is a schematic view of a first embodiment of the controller of FIG. 2.

Referring to the range-overlapping embodiment of a controller 58 in FIG. 3, electrically controlled valves 38, 40 and 42 are shown. Alternatively, the valve switching may be primarily or exclusively mechanical. A power source 52 is connected to switching terminals of first and second relays 54 and 56. The controller 58 of FIG. 3 also includes a third relay 60. When the relays are all in a relaxed condition (i.e., de-energized state), the switching terminals of the relays are electrically connected to normally closed (NC) terminals. Consequently, the power source 52 is isolated from the third relay 60, as shown in FIG. 3.

In the initial stage of evacuation, the three relays 54, 56 and 60 are in the de-energized state of FIG. 3. As a result, the first relay 54 connects the power source 52 to the bypass valve 38. As described with reference to FIG. 2, the bypass valve 38 has a relatively low rate of evacuation. This reduces the turbulence caused by the initialization of evacuation. However, relying upon the bypass valve 38 as the sole connection for reducing pressure within the vacuum chamber 28 to a level sufficient for operation of the high vacuum pump 46 may cause the total time for evacuation to be unacceptably long. Therefore, the second stage of roughing evacuation triggers activation of the main roughing valve 40. In an example of an application, the bypass valve may be activated from atmospheric pressure of approximately 760 Torr to a first deactivation pressure of 200 Torr. However, when the gauge 48 detects that the pressure within the vacuum chamber has reached a preselected activation setpoint, the second relay 56 switches to the energized state in which the power source 52 is connected to the normally open (NO) terminal of the relay. This activation setpoint may be 300 Torr, for example. Energizing the second relay 56 connects the power source 52 to the switching terminal of the third relay 60. Since the third relay is in a de-energized state, the switching terminal of the third relay couples the power source to the NC terminal, which is connected to the main roughing valve 40.

During the range of pressure from 300 Torr to 200 Torr, both the bypass valve 38 and the main roughing valve 40 are activated. However, when the deactivation setpoint of 200 Torr is reached, the first relay 54 is energized, thereby deactivating the bypass valve 38. The main roughing valve remains activated until the next preselected setpoint is reached. A suitable setpoint is 150 mTorr. At this setpoint, the third relay 60 is energized, resulting in all three relays being in an energized state. The bypass valve 38 and the roughing valve 40 will be isolated from the power source 52, while the high vacuum valve 42 will be coupled to the power source. The high vacuum pump 46 of FIG. 2 is then operated to reduce the chamber 28 to the desired pressure.

Figure 4:
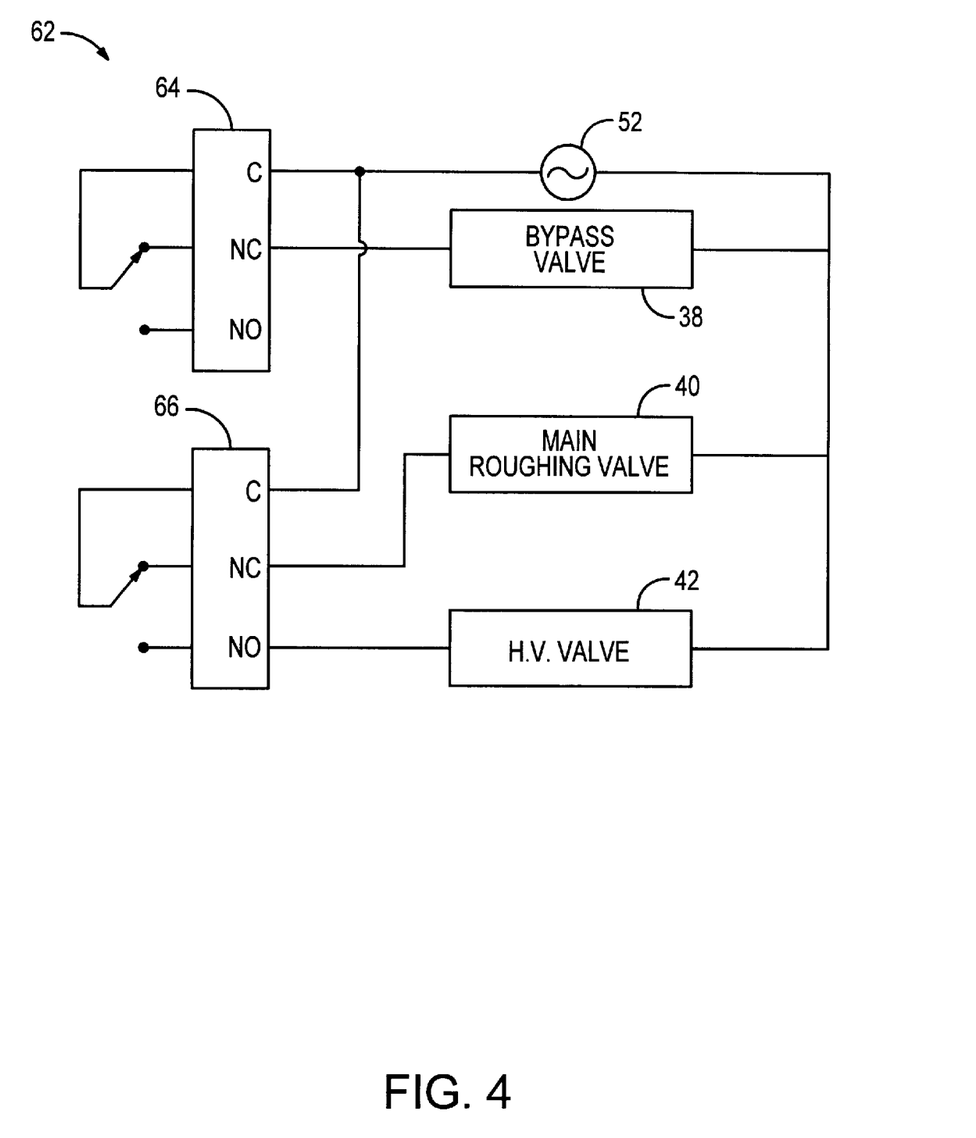
FIG. 4 is a schematic view of a second embodiment of the controller of FIG. 2.

The non-overlapping embodiment of a controller 62 is shown in FIG. 4. This embodiment includes only two relays 64 and 66. In an initial roughing stage, both relays are in the de-energized states shown in FIG. 4. Consequently, the power source 52 is electrically connected to the bypass valve 38, but is isolated from the second relay 66 that controls activation of the main roughing valve 40 and the high vacuum valve 42. The first relay 64 is energized when the gauge 48 within the chamber 28 detects that chamber pressure has been reduced to a first setpoint. When the first setpoint is reached, the first relay 64 is energized, but the second relay 66 remains in the de-energized state. This connects the main roughing valve 40 to the power source 52 and disconnects the bypass valve 38. The setpoint may be 200 Torr, but this is not critical.

The main roughing valve 40 remains activated until a second setpoint of pressure is detected within the chamber 28. An acceptable second setpoint is 150 mTorr. At this second setpoint, the second relay 66 is switched to the energized state, thereby deactivating the main roughing valve 40 and activating the high vacuum valve 42. The operation of the high vacuum valve is identical to that described with reference to FIG. 3.

After the vacuum chamber 28 has been properly purged, the steps of depositing the dielectric stack are implemented. The material used to form the spaced apart low refractive index layers is preferably silicon dioxide ($SiO_2$). The $SiO_2$ is deposited from an $SiO_2$ source material at an unconventionally low rate. It has been discovered that the optimal rate for depositing the $SiO_2$ is in the range of 1 Å/second to 3 Å/second. Preferably, the $SiO_2$ is evaporated from the $SiO_2$ source material, rather than following the conventional technique of utilizing a Si or SiO source material. An acceptable material for forming the high refractive index layers is hafnium oxide (preferably $HfO_2$).

Figure 5:
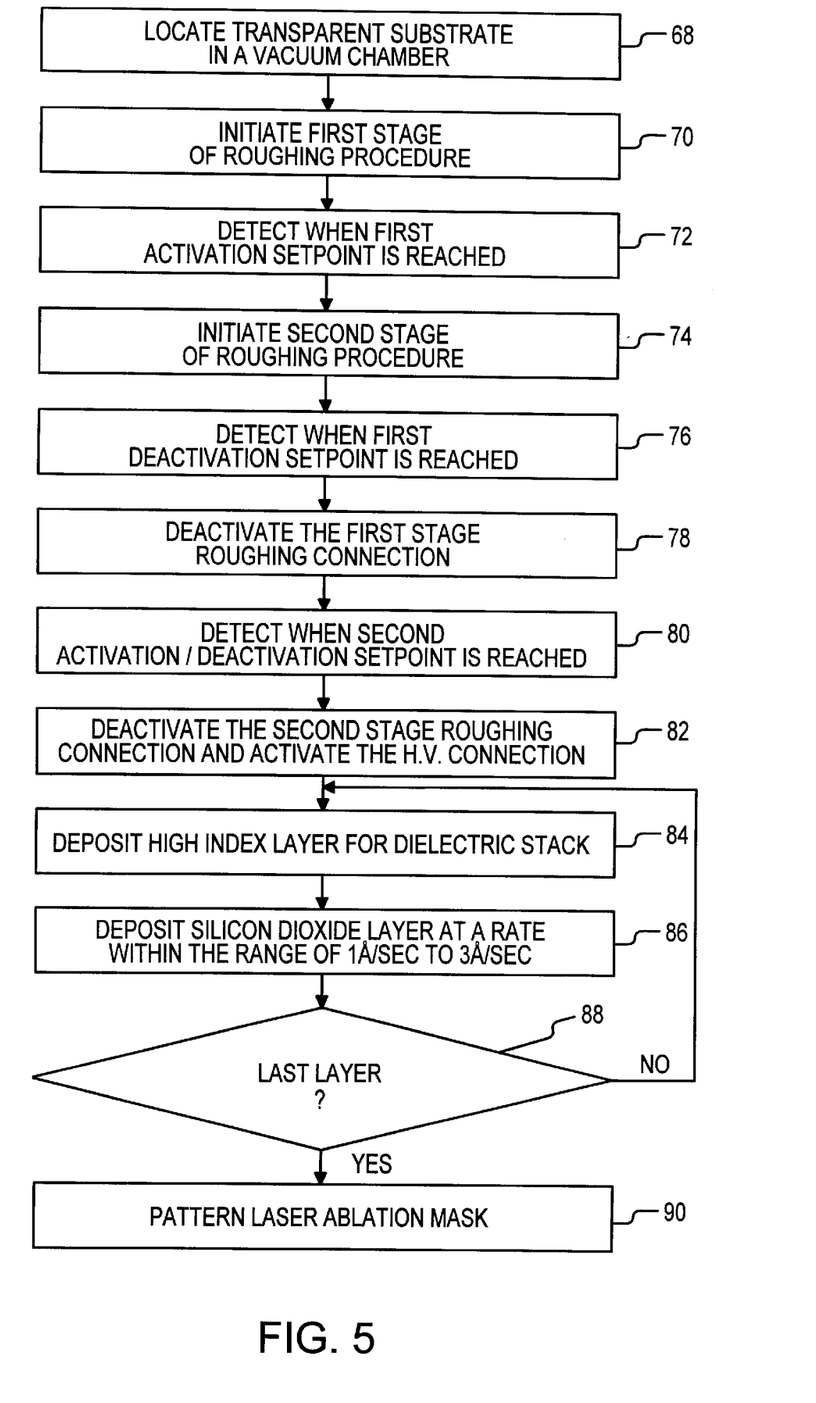
FIG. 5 is a process flow of steps for executing the controlled evacuation and controlled deposition, using the system of FIG. 2.

FIG. 5 is a process flow of steps for forming a laser ablation mask that can be used in the system of FIG. 1 for forming inkjet printheads. The initial step 68 is to locate a transparent substrate 67 in the vacuum chamber 28 of FIG. 2. The substrate is preferably-formed of quartz, but other substrate materials (e.g., silica) are known for forming laser ablation masks. In step 70, the first stage of the roughing procedure is initiated. In FIG. 2, the first roughing evacuation connection 32 is activated to begin the purging of the vacuum chamber 28. The bypass valve has a relatively low maximum rate of evacuation, so that turbulence within the chamber is controlled. Consequently, an advantage of the use of the bypass valve is that the system is less susceptible to the occurrences of particulate matter and/or water coming to rest on the surface of the substrate. As noted above, the introduction of contamination or liquid on the surface of the substrate increases the density of defects, thereby decreasing the operational life of the laser ablation mask. On the other hand, a concern with the use of the unconventionally slow first connection is that the time required to fabricate the laser ablation mask will be extended significantly. Therefore, the second stage of the roughing procedure is utilized.

In step 72, the process of monitoring the pressure within the vacuum chamber results in the detection that the first activation setpoint is reached. At this pressure, the second evacuation connection 34 is activated by operation of the main roughing valve 40, as indicated at step 74. The higher rate second evacuation connection 34 decreases the time required for the roughing procedure.

In the non-overlapping embodiment of a controller that was described with reference to FIG. 4, the detection of the first activation setpoint and the initiation of the second stage of the roughing procedure (i.e., steps 72 and 74) coincide with deactivating the first connection 32. However, in the range-overlapping embodiment of FIG. 3, the activation ranges of the first and second connections 32 and 34 overlap. This overlapping embodiment requires the additional steps 76 and 78 of detecting when the first deactivation setpoint is reached and deactivating the first connection 32.

In step 80, the second activation/deactivation setpoint is reached. This triggers the deactivation of the second evacuation connection 34. Simultaneously, the high vacuum connection 36 is activated at step 82. When the pressure within the vacuum chamber reaches the appropriate level, the deposition process begins. Optionally, an adhesion layer or a lift-off patterned masking layer may be applied to the substrate prior to the dielectric stack, as is known in the art. However, layers of greatest concern to the invention are the layers that are used to form the dielectric stack. The dielectric stack is an alternating pattern of high refractive index material and low refractive index material. Table 1 is one embodiment of a dielectric stack. The high refractive index layer material (H) may be $HfO_2$, while the low refractive index layer material (L) is preferably $SiO_2$. Measurements of layer thickness were based upon a Sycon rate controller. The coating temperature was 275° C. and the oxygen partial pressure was 1.0E–4 Torr for all materials. The resulting coating was an eighteen-layer stack with a high optical reflectivity at a wavelength of 248 nm and normal incidence on a quartz substrate.

TABLE 1

| Layer Number | Layer Material | Layer Thickness |
| --- | --- | --- |
| 1 | H | .831KÅ |
| 2 | L | .307KÅ |
| 3 | H | .831KÅ |
| 4 | L | .307KÅ |
| 5 | H | .831KÅ |
| 6 | L | .307KÅ |
| 7 | H | .831KÅ |
| 8 | L | .307KÅ |
| 9 | H | .831KÅ |
| 10 | L | .307KÅ |
| 11 | H | .831KÅ |
| 12 | L | .307KÅ |
| 13 | H | .831KÅ |
| 14 | L | .307KÅ |
| 15 | H | .831KÅ |
| 16 | L | .307KÅ |
| 17 | H | .831KÅ |
| 18 | L | .614KÅ |

In step 84 of FIG. 5, a first high index layer (H) was deposited. The deposition rate for forming the eighteen-layer stack of Table 1 was 2.0 Å/second, using 3.0 grams/cubic centimeter (g/cc) for $HfO_2$. The deposition rate of the high refractive index layers is less important than the deposition rate of the $SiO_2$.

In step 86, the first $SiO_2$ layer of the stack was formed. The optimal deposition rate is 1 Å/second to 3Å/sec. Because of the inherent fluctuations in the deposition rate, the preferred practical range is 1.6 Å/second to 2.4 Å/sec, using 2.2 g/cc physical density. Ideally, the deposition rate is approximately 2.0 Å/sec. A deposition rate above the optimal range defines a process that is susceptible to a high coating defect density. On the other hand, a deposition rate below the range may result in poor adhesion of an $SiO_2$ layer to an adjacent layer.

The decision step 88 is one in which it is determined whether the layer that was deposited at step 86 is the final layer in the dielectric stack. If the stack has not been completed, the process loops back to steps 84 and 86 to form another layer pair. When an affirmative response is generated at the decision step 88, the process advances to the step 90 of patterning the laser ablation mask to form the desired exposure pattern. In the preferred embodiment, the exposure pattern is designed for fabrication of inkjet printheads, as described with reference to FIG. 1.

What is claimed is:

1. A method of fabricating a high energy radiation mask comprising steps of:

locating a substrate in a vacuum chamber;

activating a first roughing evacuation connection to said vacuum chamber, said first roughing evacuation connection having a first maximum rate of evacuation;

detecting when pressure within said vacuum chamber is reduced to a first threshold pressure;

activating a second roughing evacuation connection to said vacuum chamber in response to detecting that said pressure is below said first threshold pressure, said second roughing connection having a second maximum rate that is greater than said first maximum rate;

detecting when pressure within said vacuum chamber is reduced to an intermediate threshold pressure that is between said first threshold pressure and a second threshold pressure;

deactivating said first roughing evacuation connection in response to detecting that said pressure within said vacuum chamber is below said intermediate threshold pressure, thereby providing a range between said first and intermediate threshold pressures in which said first and second roughing evacuation connections are simultaneously activated;

detecting when pressure within said vacuum chamber is reduced to said second threshold pressure;

activating a high vacuum pump connection to said vacuum chamber in response to detecting that said pressure is below said second threshold pressure; and depositing at least one layer on said substrate within said vacuum chamber to form a coating that is resistant to damage when exposed to a high energy beam.

2. The method of claim 1 wherein said steps of activating said first and second roughing evacuation connections include selectively operating two independent vacuum pumps.

3. The method of claim 2 wherein said step of activating said high vacuum pump includes selectively operating a diffusion pump that is independent of said vacuum pumps operated in steps of activating said first and second roughing evacuation connections.

4. The method of claim 1 further comprising the step of:

deactivating said second roughing evacuation connection in response to detecting that said pressure within said vacuum chamber is below said second threshold pressure.

5. The method of claim 1 wherein said depositing step includes vapor depositing a stack of layers for forming a laser ablation mask, including depositing a plurality of silicon oxide layers at a rate in the range of 1 Å/second to 3 Å/second.

6. The method of claim 5, wherein said step of vapor depositing includes alternating said silicon oxide layers with layers of hafnium oxide.

7. The method of claim 5 further comprising a step of patterning said layer stack to form a selected exposure pattern.

8. The method of claim 7 wherein said step of patterning is implemented to form a laser ablation mask for fabricating an inkjet printhead.

9. A method of fabricating a laser ablation mask comprising steps of:

locating a substrate in a vacuum chamber;

activating a two-stage roughing procedure for evacuating said vacuum chamber to a threshold pressure level, including;

(a) triggering a first stage roughing connection;

(b) triggering a second stage roughing connection when pressure within said vacuum chamber reaches a first threshold pressure level, including maintaining said first stage roughing connection;

(c) terminating said first stage roughing connection when said pressure within said vacuum chamber reaches an intermediate threshold pressure level less than said first threshold pressure level, including maintaining said second stage roughing connection;

activating a high evacuation vacuum procedure for evacuating said vacuum chamber to a high vacuum pressure level, said high evacuation vacuum procedure being activated when said pressure in said vacuum chamber reaches a second threshold pressure level below said first and intermediate threshold pressure levels; and depositing material on said substrate in said vacuum chamber to form a layer stack that is resistant to damage by exposure to a high energy laser source, including depositing a plurality of spaced apart silicon dioxide layers at a rate in the range of 1 Å/second to 3 Å/second.

10. The method of claim 9 further comprising a step of patterning said layer stack to form an exposure pattern for manufacturing inkjet printheads.

11. The method of claim 9 wherein said step of depositing material includes depositing hafnium layers between said silicon dioxide layers.

12. The method of claim 9 wherein said two-stage roughing procedure is implemented using two vacuum sources.

* * * * *